United States Patent [19]

Stucker

[11] 4,092,184
[45] May 30, 1978

[54] METHOD OF PREPARING AND INSTALLING COBALT-RARE EARTH PERMANENT MAGNETS

[75] Inventor: Harold Lloyd Stucker, Somersworth, N.H.

[73] Assignee: General Electric Company, Somersworth, N.H.

[21] Appl. No.: 620,796

[22] Filed: Oct. 8, 1975

[51] Int. Cl.² ............................................. H01F 1/02
[52] U.S. Cl. ................. 148/103; 148/31.57; 148/108; 324/152
[58] Field of Search ............... 148/103, 108, 31.57; 324/151 R, 151 A, 155, 152

[56] References Cited

U.S. PATENT DOCUMENTS

| | | | |
|---|---|---|---|
| 2,414,462 | 1/1947 | Grace et al. | 148/103 |
| 2,595,244 | 5/1952 | Goss et al. | 324/155 |
| 3,655,463 | 4/1972 | Benz | 148/101 |
| 3,655,464 | 4/1972 | Benz | 148/101 |
| 3,695,945 | 10/1972 | Benz | 148/103 |
| 3,802,935 | 4/1974 | Martin et al. | 148/103 |

OTHER PUBLICATIONS

Bozorth, R; Ferromagnetism; New York, 1951, pp. 9–11 & 845–849.

Primary Examiner—Walter R. Satterfield
Attorney, Agent, or Firm—R. G. Simkins; P. L. Schlamp

[57] ABSTRACT

A method for the manufacture of cobalt-rare earth permanent magnets formed of consolidated particles thereof, for installation within electromagnetic devices such as induction watthour meters, and the product thereof. The method includes the magnetization of the consolidated cobalt-rare earth to substantial saturation in a predetermined polarity, the demagnetization and installation of the cobalt-rare earth permanent magnet while in a demagnetized state in an electromagnetic device, then its remagnetization in situ within the device to substantial saturation in a magnetizing field of the same predetermined polarity.

9 Claims, 3 Drawing Figures

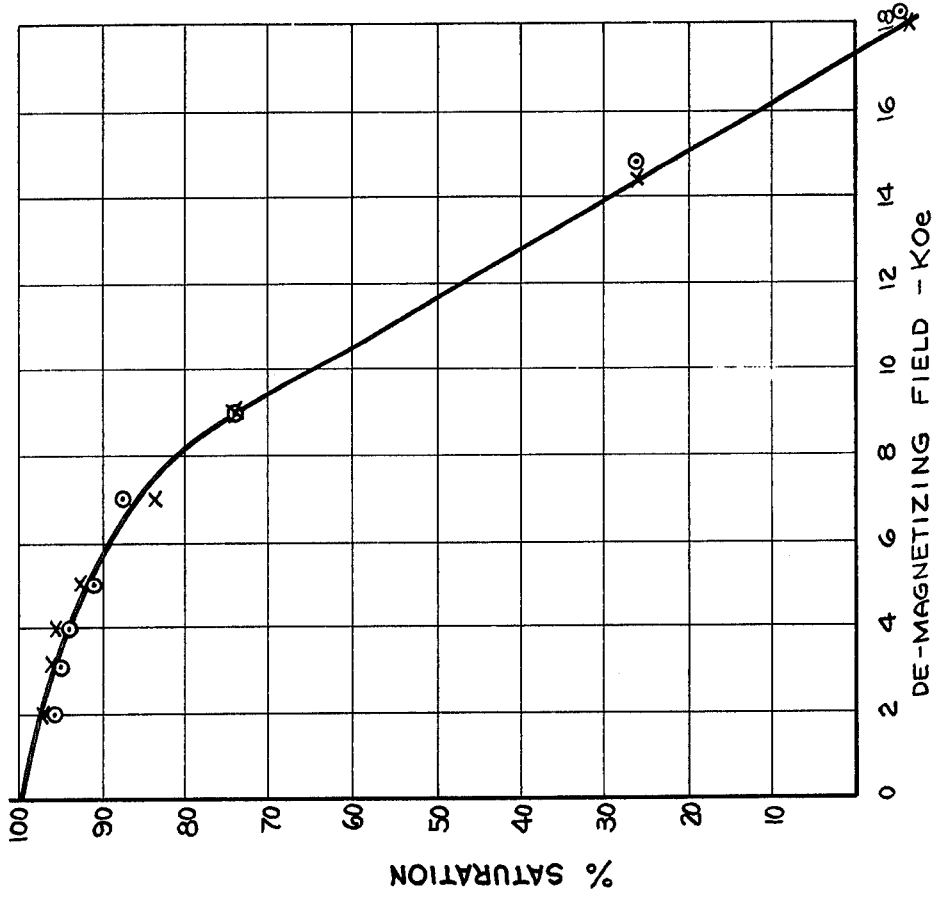
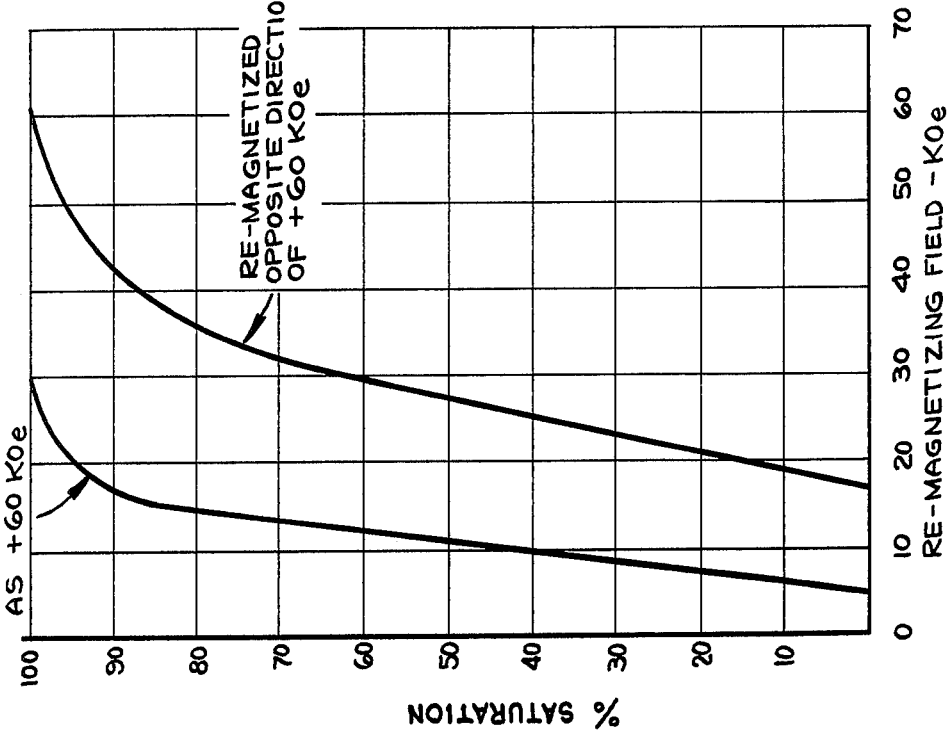

METHOD OF PREPARING AND INSTALLING COBALT-RARE EARTH PERMANENT MAGNETS

BACKGROUND OF THE INVENTION

The manufacture of permanent magnets and their installation and/or assembly within many common types of apparatus such as electromagnetic devices, frequently pose problems or difficulties which are uniquely associated with magnets and their properties. For instance, if the magnetic material or magnet unit thereof has been previously magnetized, which advantageously enables the testing and/or adjustment of its magnetic properties prior to its incorporation into an apparatus, the magnet is then susceptible to a loss or reduction of its magnetic strength, or precise level thereof, due to its inadvertent or unavoidable contact with other components or structure of magnetizable compositions during installation or assembly. Additionally, magnets inevitably attract and tenaciously hold magnetically attractive metal debris or waste which is very likely to interfere with the performance or accuracy of many electromagnetic devices. On the other hand, the magnetization of a permanent magnet following its assembly or installation within a device, aside from possibly impeding or precluding any practical testing and/or adjustment of its magnetic properties, frequently requires magnetic induction means such as coils of extensive and/or complex constructions which are not readily available or are very costly. Such induction means must also be excessively high strengths to induce the required magnetism into magnetic units inconveniently embodied or enclosed within a device. Moreover, in addition to the increased costs of such induction equipment and the limits on its efficiency in magnetizing a potential magnet preinstalled within an electromagnetic device, or even a subassembly component thereof, the high energy electrical induction field required to magnetize the magnet to saturation frequently can not be effectively insulated or segregated from other components or structure of magnetizable material of the containing device whereby they are affected by the induction field which in many instances is detrimental or destructive to electromagnetically sensitive parts or their functions.

SUMMARY OF THE INVENTION

This invention comprises a method for producing permanent magnetics of compacted particles of cobalt-rare earth materials for service in electromagnetic devices such as induction watthour meters, and the product of the method. The invention particularly includes a new and improved method of preparing and installing such cobalt-rare earth permanent magnets comprising premagnetizing the cobalt-rare earth magnet to substantial saturation in a magnetic field of predetermined polarity, demagnetizing the saturated magnet and installing or assembling it while in a demagnetized state within the device, or subassembly thereof, of its designed service, and thereafter remagnetizing the cobalt-rare earth magnet to substantial saturation within a magnetic field of the same predetermined polarity as the former magnetization whereby an induction field of substantially reduced strength will suffice.

OBJECTS OF THE INVENTION

It is a primary object of this invention to provide a method for the preparation and installation of cobalt-rare earth permanent magnets whereby the permanent magnet is magnetized in situ within an electromagnetic device, or subassembly thereof, to substantially full saturation by means of a magnetic field of significantly reduced intensity or strength such as about one-half of that normally required for saturation, and also with more economical magnetizing apparatus of smaller capacity.

It is also an object of this invention to provide a method of preparing and installing cobalt-rare earth permanent magnets in electromagnetic devices which enables the testing and/or adjustment of magnetic properties of the permanent magnets before their installation into an electromagnetic device or assembly, and subsequent installation or assembly therein while devoid of magnetism whereby any possibility of the magnet attracting and adhering contaminating metal particles is avoided.

It is a further object of this invention to provide a method for the preparation and installation of cobalt-rare earth permanent magnets in electromagnetic devices which permits the preliminary magnetization and testing of magnetic properties under optimum conditions and free of any encumbering auxiliary apparatus or structure, avoids the difficulties associated with the handling or installing of permanent magnets, and enables the subsequent remagnetization of the installed permanent magnet in situ to substantially complete saturation with an induction magnetizing field of significantly reduced intensity or strength from that needed for the original or former magnetization, whereby magnetizing means of more economical capacities suffice and the magnetizing effects upon adjacent materials and components are minimized.

It is an additional object of this invention to provide a method for the preparation of cobalt-rare earth permanent magnets formed of consolidated particles and installation of the magnets in electromagnetic devices comprising induction watthour meters including the compressing of magnetizable cobalt-rare earth particles into a cohering body and the sintering thereof to integrate the particles to a continuum of precise configurations and dimensions, the magnetization of the body to saturation, its demagnetization and installation in a meter device in an non-magnetized state, and remagnetization of the body to saturation in situ with a magnetizing field of significantly reduced intensity of approximately one-half the strength required for the former magnetization.

It is another object of this invention to provide a magnetizable cobalt-rare earth product, and electromagnetic device such as an induction watthour meter containing the magnetizable product, wherein said magnetizable product can be pretested as to its magnetic properties, then installed free of the usual handicaps associated with handling magnets, and subsequent to its installation can be remagnetized to substantial saturation with a magnetic field of reduced strength, which among other advantages, minimizes the magnetic-effect upon adjacent material and components, and enables the use of more economical and less complex induction apparatus of lower capacity.

BRIEF DESCRIPTION OF THE DRAWING

FIG. 2 of the drawing comprises a graph illustrating the remagnetizing properties of a cobalt-samarium permanent magnet; and FIG. 3 of the drawing comprises a graph illustrating the demagnetizing properties of a cobalt-samarium permanent magnet.

DESCRIPTION OF A PREFERRED EMBODIMENT

Figure 1:
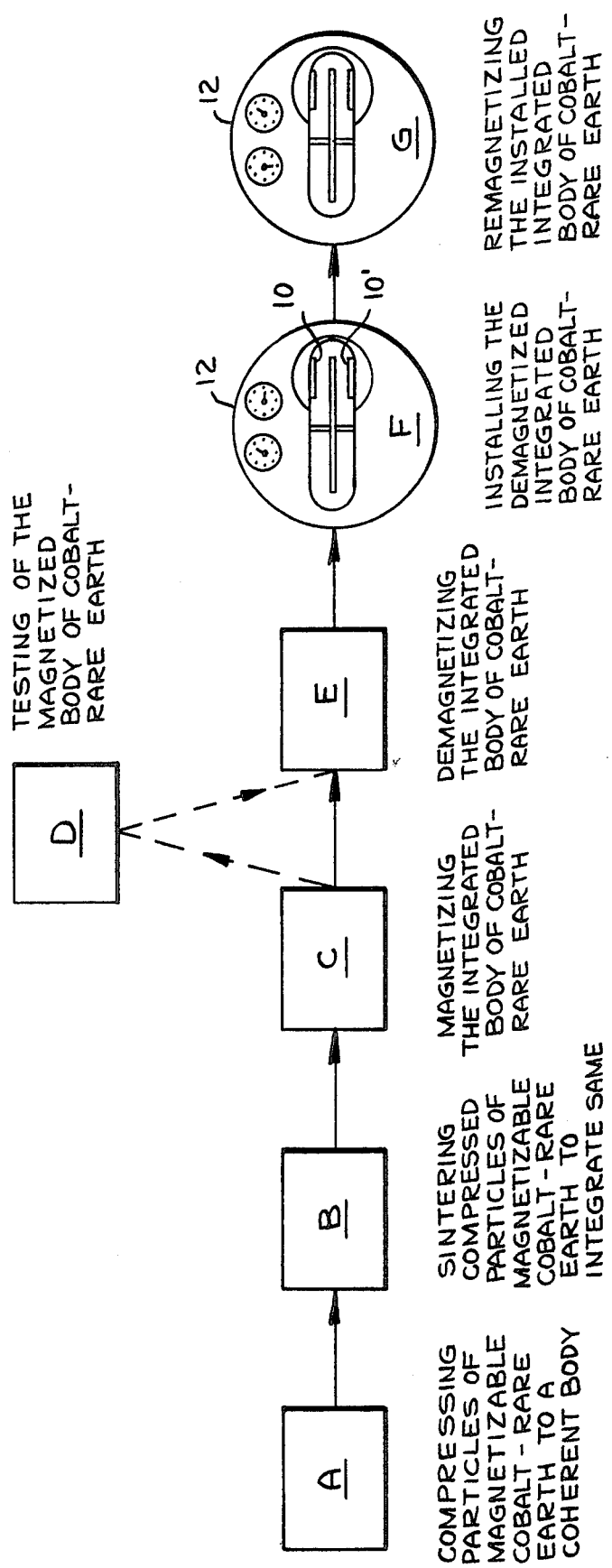
FIG. 1 of the drawing comprises a flow diagram of the method of this invention, and illustrates the product of the method.

The magnetizable cobalt-rare earth materials, and permanent or "hard" magnets formed therefrom, of this invention comprise magnetic materials principally composed of alloys of cobalt and rare earth metals such as samarium, for example $Co_5Sm$. Examples of cobalt-rare earth alloy magnets and materials therefor and their preparation which are suitable for use in the process of this invention are given in the following U.S. Pat Nos.: 3,655,463; 3,748,193; 3,856,580; 3,655,464; 3,802,935; 3,856,581; 3,695,945; 3,826,969.

The contents and disclosures of the foregoing patents are incorporated herein by reference.

Although the method and its attributes which comprise this invention for the preparation and installation of cobalt-rare earth permanent magnets formed of consolidated particles thereof, and the product of the method, have other applications and uses, this invention will be discribed in detail hereinafter with reference to an embodiment for the preparation and installation of a cobalt-samarium ($Co_5Sm$) alloy permanent magnet for service in an electromagnetic device consisting of an induction watthour meter. Examples of the type of induction watthour meters referred to hereinafter are disclosed in the following U.S. Pat. Nos.: 2,110,418; 2,316,638; 2,683,921; 2,196,898; 2,595,244; 2,272,748; 2,668,275;

In accordance with a preferred embodiment of this invention, particulate magnetizable cobalt-samarium ($Co_5Sm$), such as disclosed in U.S. Pat. Nos. 3,655,463; 3,655,464 and 3,695,945, is consolidated to an apt configuration or form by compressing the particles to a cohering green shape or body of about 50% to about 75%, preferably about 65% to about 70%, of the theoretical density of the material and then sintering the cohering green body to integrate and condense its mass to at least about 87%, and preferably to more than 90% or about 95%, of the theoretical density. Compressing of the particles of cobalt-samarium to consolidate them to a coherent body is illustrated as step A in the flow diagram of FIG. 1 of the drawing.

The initial compressing of the cobalt-samarium particles to a green body is preferably carried out within a moderate magnetizing field of between about 5 to about 20 kilo-oersteds, to induce a preliminary orientation or alignment of the material with the field in accordance with a preferred process of the above U.S. patents.

The sintering of the compressed green body should consist of a heat treatment raising the temperature of material substantially uniformly therethroughout to in excess of 1000° C, and preferably at least about 1100° C for at least one half hour, for example, approximately 1130° C for about one hour. The sintering operation is illustrated as step B in the flow diagram.

The consolidated product of the compressed and sintered cobalt-samarium particles, upon cooling is magnetized to substantially complete saturation by subjecting it to a magnetizing field of a predetermined direction of polarity and of at least about 60 kilo-oersteds, and comprises step C of the method illustrated in FIG. 1.

As an alternative to the foregoing preferred embodiment of compressing and sintering the particulate cobalt-rare earth alloy, the particles thereof can be encapsulated in non-magnetic material.

At this stage, the magnet per se, or while free of any associated components or enclosures and prior to its consignment to an assembly or device, is preferably tested and evaluated for its magnetic properties and suitability for a designed use or services. This evaluation of the magnet devoid of the encumberance of any ancillary parts or structure and before its installation greatly facilitates the test procedure and provides a substantial economy in permitting the early discarding of faulty magents prior to any installation or assemblage and without irrevocably associated parts. The testing of the magnetic properties comprises step D of the flow diagram which is illustrated as an optional operation which is not fundamental to the method of the invention.

Upon testing the magnetic properties and any other relevant aspects of the saturated magnet and a determination of its suitability, the magnet is demagnetized to facilitate its assembly with other components and/or installation into electromagnetic devices. The demagnetization of the magnet comprises step E of the method. Demagnetization of the saturated magnet can be accomplished by known means or procedures such as an electromagnetic coil with a reverse electrical field or by heating the magnet up to a temperature ranging from 40% to 75% of the Curie point of the magnetic material in accordance with U.S. Pat. No. 3,802,935, cited above. The subject cobalt-samarium ($Co_5Sm$) magnet has a Curie temperature of about 725° C and is therefor effectively demagnetized by heating to about 435° C to about 544° C for a relatively brief period of about 5 to 30 minutes.

Following its demagnetization, the cobalt-samarium permanent magnet is ready for assembly and/or installation in a magnetic-free, or unmagnetized, stated which avoids contamination with the magnetic materials and any loss or change of magnetism due to inadvertant or unavoidable exposure to demagnetizing circumstances. The magnet, devoid of its magnetism, is accordingly assembled with other components and/or installed in an appropriate electromagnetic device comprising, for example, a damping magnet system for a disk armature in an induction watthour meter. For example, referring to FIG. 1, the demagnetized integrated bodies of cobalt-rare earth from step E which is illustrated as part 10 and 10′ is installed in an electromagnetic device consisting of induction watthour meter 12. Once assembled and/or installed in either an appropriate subassembly or the complete device, the demagnetized magnet is remagnetized according to this invention.

It is a particularly significant feature and advantage of this invention that the cobalt-rare earth permanent magnets formed of consolidated particles thereof, are remagnetized to substantially complete saturation with significantly less energy or field strength of about one-half that required for the original or former magnetization if the magnetizing field is applied in the same polar direction as in the original or former magnetization thereof. For example, the original or former magnetization of the consolidated cobalt-samarium permanent magnet to saturation required a magnetizing field of about 60 kilo-oersteds, and by reapplying the magnetizing field in the same polarity as before, the consolidated cobalt-samarium can be remagnetized to saturation with a magnetic field of substantially reduced intensity of about only 30 kilo-oersteds.

The remagnetizing of the installed magnetizable body, or bodies 10 and 10', of cobalt-rare earth subsequent to their installation within the electromagnetic device consisting of an induction watthour meter is shown as step G in the flow diagram of FIG. 1.

This magnetic phenomenon of an apparent retention of a preferred remagnetizing direction or magnetic memory of the cobalt-rare earth permanent magnets, is an especially advantageous characteristic in many applications of the present invention such as preparing and installing permanent magnets in induction watthour meters as the damping magnets for the disk armature. For example, the process of this invention enables the demagnetization of the cobalt-rare earth permanent magnet and its installation in an unmagnetized or magnetic-free state whereupon it is thereafter remagnetized to saturation in situ assembled and/or installed within the watthour meter structure with a magnetizing field of only about one half the intensity or strength of that required for the original or former magnetization. Effecting the remagnetization to substantial saturation with a field of much lower intensity or strength, such as about one half of that otherwise required, reduces the costs of the magnetic induction apparatus and its operation, particularly wherein it must be of sufficiently large dimensions and of a configuration to embrace ancilliary components or structure incorporated with the magnet body, and, among other benefits, decreases the intensity of the field influence of the induction apparatus upon components or structure adjacent to the magnets which are not designated as magnets.

The magnetization, demagnetization and remagnetization properties in relation to field strength for the cobalt-samarium ($CO_5Sm$) permanent magnet of the preferred embodiment and example of the practice of the process of this invention, are illustrated in the graphs of FIGS. 2 and 3 of the drawings. These graphs provide data demonstrating that the remagnetization to saturation of the cobalt-samarium permanent magnet can be accomplished with a magnetizing field, applied in the same polarity as before, of about only one half the intensity of that required for its initial magnetization.

Although the invention has been described with reference to certain specific embodiments thereof, numerous modifications are possible and it is desired to cover all modifications falling within the spirit and scope of this invention.

What I claim as new and desire to secure by Letters Patent of the United States is:

1. A method for preparing a cobalt-rare earth permanent magnet and installing same in an electromagnetic device, comprising the steps of:
   (a) magnetizing an integrated body of compressed and sintered cobalt-rare earth particles in a magnetizing field of a predetermined direction of polarity and of at least approximately 60 kilo-oersteds to substantially completely magnetically saturate the cobalt-rare earth body;
   (b) demagnetizing the substantially saturated body of cobalt-rare earth;
   (c) installing the demagnetized body of cobalt-rare earth in an electromagnetic device; and
   (d) remagnetizing the installed body of cobalt-rare earth in a magnetizing field of the same predetermined direction of polarity and of a strength of not more than approximately one half as that of the previous magnetization to substantially complete magnetic saturation.

2. The method of claim 1, wherein the cobalt-rare earth is cobalt-samarium.

3. A method for preparing a cobalt-rare earth permanent magnet and installing same in an electromagnetic device comprising an induction watthour meter, comprising the steps of:
   (a) magnetizing an integrated body of compressed and sintered cobalt-samarium particles in a magnetizing field of a predetermined direction of polarity and of approximately 60 kilo-oersteds to substantially completely magnetically saturate the cobalt-samarium body;
   (b) testing the magnetic properties of the magnetized body of cobalt-samarium;
   (c) demagnetizing the substantially magnetically saturated body of cobalt-samarium which meet said test;
   (d) installing the demagnetized body of cobalt-samarium in an electromagnetic device comprising an induction watthour meter; and
   (e) remagnetizing the installed body of cobalt-samarium in a magnetizing field of the same predetermined direction of polarity as that used in the previous magnetization and of approximately 30 kilo-oersteds to substantially complete magnetic saturation.

4. A method for preparing a cobalt-rare earth permanent magnet and installing same in an electromagnetic device, comprising the steps of:
   (a) compressing magnetizable cobalt-rare earth particles to a cohering body;
   (b) sintering the cohering body of cobalt-rare earth particles to integrate the same by heating said body up to a temperature of at least about 1000° C;
   (c) magnetizing the integrated body of compressed and sintered cobalt-rear earth to substantially complete magnetic saturation;
   (d) demagnetizing the substantially magnetically saturated body of cobalt-rare earth;
   (e) installing the demagnetized body of cobalt-rare earth in an electromagnetic device; and
   (f) remagnetizing the installed body of cobalt-rare earth to substantially complete magnetic saturation in a magnetizing field of the same polar direction and at a strength of not more than approximately one half of that used in the previous magnetization.

5. The method of claim 4, wherein the cobalt-rare earth comprises cobalt-samarium.

6. The method of claim 4, wherein the magnetization field is at least approximately 60 kilo-oersteds and the remagnetization field in the same polar direction is approximately 30 kilo-oersteds.

7. A method for preparing a cobalt-rare earth permanent magnet and installing same in an electromagnetic device, comprising the steps of:
   (a) compressing magnetizable cobalt-rare earth particles to a cohering body in an aligning magnetizing field,
   (b) sintering the cohering body of cobalt-rare earth particles to integrate the same by heating said body therethrough up to a temperature of at least about 1000° C;
   (c) magnetizing the integrated body of compressed and sintered cobalt-rare earth in a magnetizing field of a predetermined direction of polarity and of at least approximately 60 kilo-oersteds to substantially completely magnetically saturate the cobalt-rare earth body;

(d) demagnetizing the substantially completely saturated body of cobalt-rare earth;

(e) installing the demagnetized body of cobalt-rare earth in an electromagnetic device; and (f) remagnetizing the installed body of cobalt-rare earth in a magnetizing field of the same predetermined direction of polarity as that used in the previous magnetization and of a strength of approximately 30 kilo-oersteds to substantially complete magnetic saturation.

8. The method of claim 7, wherein the cobalt-rare earth comprises cobalt-samarium.

9. A method for preparing a cobalt-rare earth permanent magnet and installing same in an electromagnetic device comprising an induction watthour meter, comprising the steps of:

(a) compressing magnetizable cobalt-samarium particles to a cohesive green body of about 50% to about 75% of density in an aligning magnetizing field ranging from about 5 to about 20 kilo-oersteds;

(b) sintering the cohering body of cobalt-samarium particles to integrate the same to at least about 88% of density by heating said body therethrough at a temperature of about 1100° C for at least about one half hour;

(c) magnetizing the integrated body of compressed and sintered cobalt-samarium particles in a magnetizing field of a predetermined direction of polarity and of approximately 60 kilo-oersteds to substantially completely magnetically saturate the cobalt-samarium body;

(d) demagnetizing the substantially completely saturated body of cobalt-samarium;

(e) installing the demagnetized body of cobalt-samarium in an electromagnetic device comprising an induction watthour meter; and (f) remagnetizing the installed body of cobalt-samarium in a magnetizing field of the same predetermined direction of polarity as that used in the previous magnetization and of approximately 30 kilo-oersted to substantially complete magnetic saturation.

* * * * *